United States Patent
Uehigashi (10) Patent No.: US 10,840,339 B2
(45) Date of Patent: Nov. 17, 2020

(54) SILICON CARBIDE SEMICONDUCTOR SUBSTRATE AND SILICON CARBIDE SEMICONDUCTOR DEVICE

(71) Applicant: DENSO CORPORATION, Kariya (JP)

(72) Inventor: Hideyuki Uehigashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 36 days.

(21) Appl. No.: 16/254,724

(22) Filed: Jan. 23, 2019

(65) Prior Publication Data

US 2019/0252503 A1   Aug. 15, 2019

(30) Foreign Application Priority Data

Feb. 9, 2018   (JP) .................................. 2018-22211

(51) Int. Cl.
*H01L 29/16* (2006.01)
*H01L 29/78* (2006.01)
*H01L 29/423* (2006.01)
*H01L 29/36* (2006.01)
*H01L 21/02* (2006.01)
*H01L 29/08* (2006.01)
*H01L 29/10* (2006.01)
*H01L 29/66* (2006.01)
*H01L 21/324* (2006.01)

(52) U.S. Cl.
CPC .... *H01L 29/1608* (2013.01); *H01L 21/02378* (2013.01); *H01L 21/324* (2013.01); *H01L 29/086* (2013.01); *H01L 29/0865* (2013.01); *H01L 29/1095* (2013.01); *H01L 29/36* (2013.01); *H01L 29/4236* (2013.01); *H01L 29/66734* (2013.01); *H01L 29/7805* (2013.01); *H01L 29/7813* (2013.01)

(58) Field of Classification Search
CPC .......... H01L 29/1608; H01L 21/02378; H01L 21/324; H01L 29/086; H01L 29/0865; H01L 29/1095; H01L 29/36; H01L 29/4236; H01L 29/66734; H01L 29/7805; H01L 29/7813; H01L 27/2454; H01L 29/7827; H01L 21/823487; H01L 21/823885; H01L 29/66325–66348
See application file for complete search history.

(56) References Cited

U.S. PATENT DOCUMENTS

2013/0330896 A1* 12/2013 Miyahara .......... H01L 29/66068
                                                                 438/270
2015/0041886 A1*  2/2015 Pala .................... H01L 29/7827
                                                                 257/330

(Continued)

OTHER PUBLICATIONS

M. Skowronski and S. Ha, "Degradation of hexagonal silicon-carbide-based bipolar devices," Applied Physics Reviews Focused Review, Journal of Applied Physics 99, 011101, 2006.

(Continued)

*Primary Examiner* — Shahed Ahmed (74) *Attorney, Agent, or Firm* — Posz Law Group, PLC (57) ABSTRACT

A silicon carbide semiconductor substrate includes a first conductivity type substrate doped with a first conductivity type impurity to have a first conductivity type and having a specific resistance of 30 mΩcm or less. A lifetime of minority carriers in the first conductivity type substrate is set to 100 nsec or less.

13 Claims, 4 Drawing Sheets

(56) References Cited

U.S. PATENT DOCUMENTS

2016/0336390 A1* 11/2016 Hamada ............ H01L 29/66068
2018/0012758 A1* 1/2018 Tsuchida ................. C30B 25/20

OTHER PUBLICATIONS

Takeshi Tawara et al., "Suppression of the Forward Degradation in 4H—SiC PiN Diodes by Employing a Recombination-Enhanced Buffer Layer," Silicon Carbide and Related Materials 2016, Materials Science Forum ISSN: 1662-9760, vol. 897, pp. 419-422, 2017.
Takeshi Tawara et al., "Suppression of the stacking faults expansion in 4H—SiC PiN diode by employing a recombination enhancing layer," Advanced Power Semiconductors 4th Lecture, pp. 17-18, Nov. 2, 2017. [English abstract attached).
T. Kimoto et al., "Understanding and Reduction of Degradation Phenomena in SiC Power Devices," 2017 IEEE International Reliability Physics Symposium (IRPS), pp. 2A-1.1-2A-1.7, Apr. 2017.

\* cited by examiner

SILICON CARBIDE SEMICONDUCTOR SUBSTRATE AND SILICON CARBIDE SEMICONDUCTOR DEVICE

CROSS REFERENCE TO RELATED APPLICATION

The present application claims the benefit of priority from Japanese Patent Application No. 2018-22211 filed on Feb. 9, 2018. The entire disclosure of the above application is incorporated herein by reference.

TECHNICAL FIELD

The present disclosure relates to a silicon carbide (hereinafter referred to as SiC) semiconductor substrate and a SiC semiconductor device.

BACKGROUND

Conventionally, a power device has been developed, for example, to realize a low-loss inverter, and a SIC-MOSFET has been developed as an example of the power device. For example, in a case where a SiC-MOSFET is used as a switching element of an inverter, a load current may flow when the SiC-MOSFET is switched on or off and may cause an element breakdown. Therefore, it is necessary to provide a freewheel diode with the SiC-MOSFET.

SUMMARY

The present disclosure provides a SiC semiconductor substrate that includes a first conductivity type substrate doped with a first conductivity type impurity to have a first conductivity type and having a specific resistance of 30 mΩcm or less. A lifetime of minority carriers in the first conductivity type substrate is set to 100 nsec or less.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

In a case where a SiC-MOSFET is used as a switching element of an inverter, and a freewheel diode is provided as a separate element with the SiC-MOSFET, the number of devices increases and a cost increases. Thus, a PN diode that is provided parasitically due to a structure of a SiC-MOSFET is used as a freewheel diode. For example, a SiC-MOSFET has a structure in which an $n^-$-type drift layer, a p-type base region, and an $n^+$-type source region are formed in the stated order on an $n^+$-type substrate, and a PN junction of the $n^-$-type drift layer and the p-type base region forms a parasitic PN diode. Therefore, when the SiC-MOSFET is applied to an inverter, by using the parasitic PN diode as a freewheel diode, it is not necessary to separately provide a freewheel diode, and the number of parts can be reduced (hereinafter, the parasitic PN diode is referred to as a parasitic FWD).

When the parasitic FWD is operated as diode, holes serving as minority carriers diffused from the p-type base region side into the $n^-$-type drift layer and electrons in the $n^-$-type drift layer are recombined. Due to the recombination energy at the time, basal plane dislocations (hereinafter referred to as BPDs) in the $n^-$-type drift layer made of an epitaxial film expand and become stacking faults (hereinafter referred to as SFs) called single Shockley stacking faults. Since the BPDs are linear defects, an occupancy area in the cell region of the SiC semiconductor device is small and an influence on a device operation is little. However, when the BPDs become the SFs, the occupancy area in the cell region increases, and the influence on the device operation such as a deterioration of a forward voltage (hereinafter referred to as Vf) increases.

In order to reduce the influence of the recombination energy on the device operation, it is necessary to design such a structure that a recombination current at driving the parasitic FWD does not reach the substrate. For example, in a structure according to a comparative example, a recombination enhancing layer having an n-type impurity concentration of $1 \times 10^{18}/cm^3$ or higher, which is higher than an n-type impurity concentration of an $n^-$-type drift layer, is formed between the $n^-$-type drift layer and an $n^+$-type substrate so as to shorten a carrier lifetime.

The carriers can be easily recombined by providing the recombination enhancing layer. However, the recombination enhancing layer is formed by increasing the n-type impurity concentration to be higher than the $n^-$-type drift layer and using a transition element such as vanadium or titanium as an impurity. Thus, there are issues in a device manufacturing that a cost increases due to an increase of a film thickness of an epitaxial film and it is difficult to guarantee wafers due to difficulties in measuring a concentration and the film thickness of the epitaxial film.

On the other hand, there is a report that BPDs in an $n^+$-type substrate having a high impurity concentration are the main factor causing an influence on a device operation such as a Vf deterioration. That is, the BPDs present in the $n^+$-type substrate propagate to an $n^-$-type drift layer and become SFs. Since a technique to convert the BPDs present in the $n^+$-type substrate into threading edge dislocations (TEDs), which have less effect on a device, in the $n^-$-type drift layer has been improved, the BPDs propagating to the $n^-$-type drift layer have been reduced. However, the BPDs have not been eliminated yet. In the current $n^+$-type substrate, the BPDs are present at a density of $500/cm^2$ to thousands of/$cm^2$. Therefore, it is important to restrict the influence of the BPDs present in the $n^+$-type substrate.

A SiC semiconductor substrate according to an aspect of the present disclosure includes a first conductivity type substrate doped with a first conductivity type impurity to have a first conductivity type and having a specific resistance of 30 mΩcm or less. A lifetime of minority carriers in the first conductivity type substrate is set to 100 nsec or less.

As described above, the lifetime of the minority carriers in the first conductivity type substrate is set to 100 nsec or less. Therefore, in a case where a semiconductor element such as a vertical MOSFET is formed using the SiC semiconductor substrate including the first conductivity type substrate, even if the minority carriers arrive at the first conductivity type substrate, the minority carriers disappear in a short period, and BPDs present in the first conductivity type substrate can be restricted from becoming SFs. Accordingly, an influence on a device operation due to the SFs can be restricted.

Hereinafter, embodiments of the present disclosure will be described with reference to the drawings. In the following embodiments, the same or equivalent parts are denoted by the same reference numerals.

First Embodiment

Figure 1:
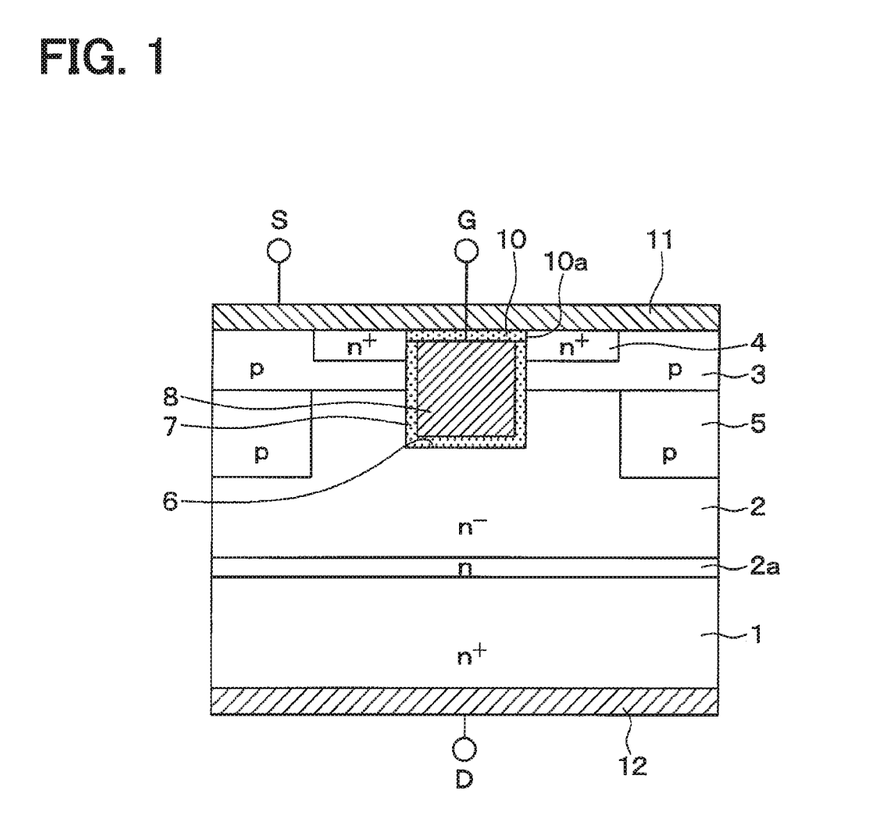
FIG. 1 is a cross-sectional view of a SiC semiconductor device according to a first embodiment.

A first embodiment will be described. In a SiC semiconductor device according to the present embodiment, a vertical MOSFET is formed as a semiconductor element having a MOS structure as shown in FIG. 1. The MOSFET is formed in a cell region of the SiC semiconductor device, and an outer peripheral high breakdown voltage structure is formed to surround the cell region to form the SiC semiconductor device. However, only the MOSFET is shown in FIG. 1. In the following description, a lateral direction in FIG. 1 is referred to as a width direction and a vertical direction in FIG. 1 is referred to as a thickness direction or a depth direction.

In the SiC semiconductor device, an $n^+$-type substrate 1 made of SiC doped with an n-type impurity such as nitrogen (N) is used. In the present embodiment, a normal direction of a paper surface of FIG. 1 corresponds to an off direction. As the $n^+$-type substrate 1, an off substrate having a surface in a (0001) Si plane and having a predetermined off angle is used. An off direction is set to <11-20>, for example. An n-type impurity concentration of the $n^+$-type substrate 1 is, for example, $5.0 \times 10^{18}/cm^3$ to $1.0 \times 10^{20}/cm^3$, a specific resistance is 30 mΩcm or less, for example 20 mΩcm, and a lifetime of holes serving as minority carriers is 100 nsec or less.

An $n^-$-type drift layer 2 made of SiC, a p-type base region 3, and an $n^+$-type source region 4 are epitaxially grown in the stated order on a main surface of the $n^+$-type substrate 1.

The $n^-$-type drift layer 2 is made of n-type SiC into which an n-type impurity such as nitrogen are introduced, and has an n-type impurity concentration of $1.0 \times 10^{15}/cm^3$ to $5.0 \times 10^{16}/cm^3$, a thickness of 5 μm to 50 μm, for example, 10 μm. In the $n^-$-type drift layer 2, a lifetime of holes serving as minority carriers is set to 1 μsec or less, preferably 0.1 μsec or less. Further, for example, a $Z_{1/2}$ center derived from C vacancies may be introduced into the $n^-$-type drift layer 2. The density of the $Z_{1/2}$ center in the $n^-$-type drift layer 2 is, for example, $2 \times 10^{13}/cm^3$ or more. Because the $Z_{1/2}$ center functions as a lifetime killer, the lifetime of minority carriers is set to 1 μsec or less, preferably 0.1 μsec or less.

A carrier lifetime can be measured by, for example, a microwave photo conductivity decay (μ-PCD). The μ-PCD method is a method of measuring a lifetime in a noncontact and non-destructive manner from a time change of a microwave reflectance, and is a general method for measuring the lifetime. For example, a measurement by the μ-PCD method can be performed using a laser such as YLF-3 HG having a wavelength of 349 nm and YAG-4 HG having a wavelength of 266 nm. Not limited to the μ-PCD method, the carrier lifetime can also be measured by other methods such as a time-resolved photoluminescence (TRPL) method.

It has been confirmed that the lifetime of the minority carriers in the $n^+$-type substrate 1 is 2.5 ns or less, which is the lower limit value that can be measured by an existing lifetime measuring apparatus using the μ-PCD method. The lifetime of the minority carriers in the $n^+$-type substrate 1 may be at least 100 nsec or less, but the shorter the better, and the lifetime of 2.5 ns or less can be realized.

Note that a buffer layer 2a having a higher impurity concentration than the impurity concentration of the $n^-$-type drift layer 2 may be formed at a boundary between the $n^-$-type drift layer 2 and the $n^+$-type substrate 1, if necessary. The buffer layer 2a has an n-type impurity concentration between the impurity concentrations of the $n^+$-type substrate 1 and the $n^-$-type drift layer 2, for example, $2 \times 10^{19}/cm^3$, and has a thickness about 1 μm. The buffer layer 2a can be formed by epitaxial growth in a manner similar to the $n^-$-type drift layer 2. The buffer layer 2a may also be made of n-type SiC in which an n-type impurity such as nitrogen is introduced and does not need to use vanadium, titanium or the like as in the recombination enhancing layer.

The p-type base region 3 is a portion in which a channel region is formed. The p-type base region 3 is made of p-type SiC in which a p-type impurity such as aluminum (Al) is introduced and has a p-type impurity concentration of, for example, about $2.0 \times 10^{17}/cm^3$ and a thickness of 0.5 μm to 2 μm. In addition, a surface layer portion of the p-type base region 3 is formed as a contact region in which a p-type impurity concentration is higher than the other portion of the p-type base region 3.

The $n^+$-type source region 4 is made of n-type SiC into which an n-type impurity such as nitrogen are introduced and has an impurity concentration higher than the impurity concentration of the $n^-$-type drift layer 2. The $n^+$-type source region 4 has an n-type impurity concentration of, for example, $2.5 \times 10^{18}/cm^3$ to $1.0 \times 10^{19}/cm^3$ at a surface layer portion and a thickness of about 0.5 μm to 2 μm.

Further, p-type deep layers 5 are formed at surface layer portions of the $n^-$-type drift layer 2, that is, below the p-type base region 3. The p-type deep layers 5 have a p-type impurity concentration higher than the impurity concentration of the p-type base region 3. The p-type deep layers 5 are disposed at regular intervals without intersecting with each other so that an upper surface layout has a stripe shape. For example, each of the p-type deep layers 5 has a p-type impurity concentration of $1.0 \times 10^{17}/cm^3$ to $1.0 \times 10^{19}/cm^3$ and a width of 0.7 μm. In addition, each of the p-type deep layers 5 has a depth of 0.4 μm or more and is formed to a position deeper than a trench gate structure described later so as to restrict an electric field from entering the trench gate structure.

In the present embodiment, the p-type deep layers 5 are formed only in the surface layer portions of the $n^-$-type drift layer 2. However, the p-type deep layers 5 may also be formed to penetrate through the $n^+$-type source region 4 and the p-type base region 3 and reach the $n^-$-type drift layer 2. For example, trenches may be formed from the surface of the $n^+$-type source region 4, and the p-type deep layers 5 may be formed so as to bury the trenches.

In addition, a gate trench 6 is formed to have, for example, a width of 0.8 μm and a depth of 0.2 μm to 0.4 μm deeper than a total film thickness of the p-type base region 3 and the n+-type source region 4, so as to penetrate through the p-type base region 3 and the n+-type source region 4 and reach the n−-type drift layer 2. The p-type base region 3 and the n+-type source region 4 described above are disposed so as to be in contact with a side surface of the gate trench 6. The gate trench 6 is formed in a line-shaped layout in which a right and left direction of the paper plane of FIG. 1 is defined as a width direction, a normal direction of the paper plane is defined as a longitudinal direction, and an upper and lower direction of the paper plane is defined as a depth direction. Although only one gate trench 6 is shown in FIG. 1, a plurality of gate trenches 6 is disposed at a regular interval in the right and left direction of the paper plane, and each of the gate trenches 6 is sandwiched between the p-type deep layers 5 so as to have a stripe shape.

A portion of the p-type base region 3 located on the side surface of the gate trench 6 functions as a channel region connecting between the n+-type source region 4 and the n−-type drift layer 2 during the operation of the vertical MOSFET. On the inner wall surface of the gate trench 6 including the channel region, a gate insulating film 7 is formed. A gate electrode 8 made of doped polysilicon is formed on a surface of the gate insulating film 7, and an inside of the gate trench 6 is filled with the gate insulating film 7 and the gate electrode 8. The trench gate structure is formed as described above.

On the surfaces of the gate insulating film 7 and the gate electrode 8, an interlayer insulating film 10 is formed. The interlayer insulating film 10 has a contact hole 10a, and the n+-type source region 4 and the contact region of the p-type base region 3 is exposed through the contact hole 10a. In FIG. 1, the interlayer insulating film 10 is left only in the gate trench 6, and a portion where the interlayer insulating film 10 is not formed functions as the contact hole 10a. The interlayer insulating film 10 is not limited to being formed in the gate trench 6 and may be formed outside the gate trench 6.

Further, on the interlayer insulating film 10, a source electrode 11 and a gate wiring layer (not shown) are formed. The source electrode 11 is in contact with the n+-type source region 4 and the contact region of the p-type base region 3 through the contact hole 10a. The gate wiring layer is in contact with the gate electrode 8 in a cross section different from a cross section shown in FIG. 1.

The source electrode 11 and the gate wiring layer are made of a plurality of metals, for example, Ni/Al or the like. At least a portion of the metals being in contact with n-type SiC, specifically, the n+-type source region 4, is made of a metal capable of ohmic contact with the n-type SiC. In addition, at least a portion of the metals being in contact with n-type SiC, specifically, the p-type base region 3, is made of a metal capable of ohmic contact with the p-type SiC. Note that the source electrode 11 and the gate wiring layer are electrically insulated by being separated from each other on the interlayer insulating film 10.

Further, a drain electrode 12 electrically connected to the n+-type substrate 1 is formed on a rear surface of the n+-type substrate 1. With such a structure, a vertical MOSFET of an n-channel inverted type trench gate structure is provided. A plurality of such vertical MOSFETs is arranged in a plurality of cells respectively to form a cell region. Then, an outer peripheral high breakdown voltage structure using, for example, a guard ring (not shown), is formed to surround the cell region in which the vertical MOSFETs are formed so as to form the SiC semiconductor device.

The SiC semiconductor device having the vertical MOSFETs formed as described above is operated, for example, by applying a gate voltage Vg of 20 V to the gate electrode 8 in a state where a source voltage Vs is 0 V and a drain voltage Vd is 1 V to 1.5 V. That is, when the gate voltage Vg is applied to the vertical MOSFET, the channel region is formed at the portion of the p-type base region 3 being in contact with the gate trench 6, and electric current flows between the drain and the source.

Figure 2:
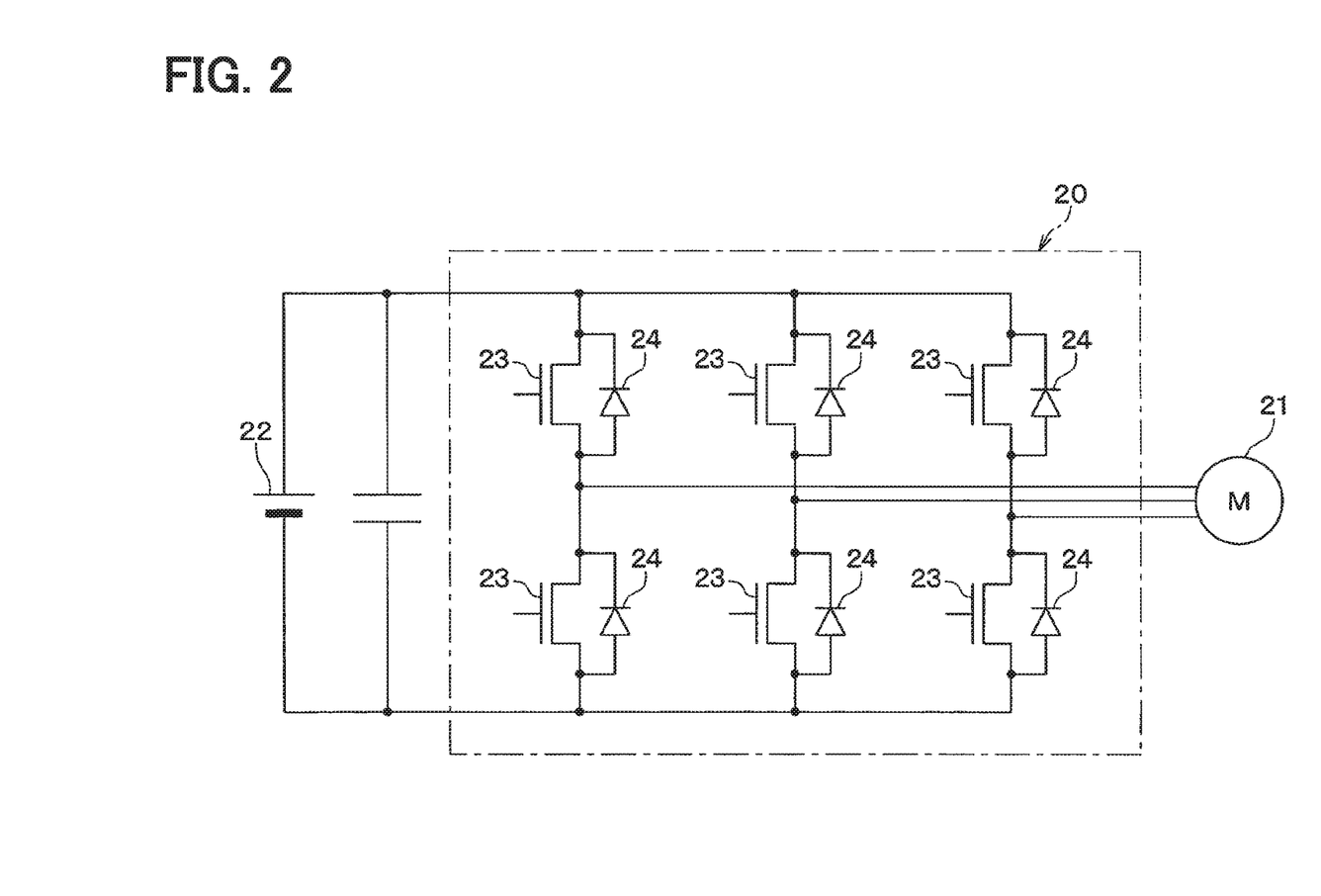
FIG. 2 is a diagram showing an example of an inverter circuit to which the SiC semiconductor device having a vertical MOSFET shown in FIG. 1 is applied.

The vertical MOSFETs in the SiC semiconductor device are applied, for example, to an inverter circuit 20 as shown in FIG. 2. The inverter circuit 20 is used, for example, for driving a three-phase motor 21, and is used for supplying an alternating current to the three-phase motor 21 using a direct current power source 22. The inverter circuit 20 includes a plurality of bridge circuits connected in parallel, and each of the bridge circuits includes an upper arm and a lower arm connected in series to the direct current power source 22. The inverter circuit 20 supplies the alternating current to a load by turning on or off the upper arm and the lower arm of each of the bridge circuits alternately and repeatedly. Each of the upper arm and the lower arm of each phase is formed of the vertical MOSFET 23, and a freewheel diode 24 is connected in parallel to each of the vertical MOSFETs 23 so as to form the inverter circuit 20. In the present embodiment, a parasitic FWD provided by a PN junction of the n−-type drift layer 2 and the p-type base region 3 functions as the freewheel diode 24.

Specifically, in each of the bridge circuits of the inverter circuit 20, the vertical MOSFET 23 of the upper arm is turned on and the vertical MOSFET 23 of the lower arm is turned off to perform a power supply to the load. Then, the vertical MOSFET 23 of the upper arm is turned off and the vertical MOSFET 23 of the lower arm is turned on to stop the power supply.

An operation for switching the vertical MOSFET 23 of the upper arm from on to off is performed, for example, as described below.

First, when the vertical MOSFET 23 of the upper arm is on, the vertical MOSFET 23 is in a steady energizing state in forward bias. Thus, electrons are supplied from the drain side into the n−-type drift layer 2 through the n+-type substrate 1, and holes are supplied from the source side to the p-type base region 3. Further, the electrons and the holes move due to the electric field caused by the forward bias, and carriers are filled in the n−-type drift layer 2 and the p-type base region 3.

Next, when the vertical MOSFET 23 of the upper arm is switched off from the above-described state, a reverse bias is applied. Thus, each carrier flows backward in a direction opposite to the direction in which each carrier move in the forward bias. Therefore, in the vertical MOSFET 23 of the upper arm, a reverse current flows in the parasitic FWD during this turn-off period.

When a large current flows through the parasitic FWD, if a lifetime of minority carriers is long, the holes can reach the n+-type substrate 1. In the n−-type substrate 1 having the high impurity concentration, the number of BPDs is larger than the number of BPDs in the n−-type drift layer 2. Thus, when the holes reach the n+-type substrate 1, an occupancy area when the BPDs become the SFs increases, and an influence on a device operation increases.

On the other hand, in the SiC semiconductor device according to the present embodiment, the lifetime of the minority carriers in the n+-type substrate 1 is set to 100 nsec or less. Therefore, even if the minority carriers reach the n+-type substrate 1, the minority carriers disappear in a short period, and the BPDs present near an interface between the n+-type substrate 1 and the n−-type drift layer 2 can be restricted from becoming the SFs. Accordingly, an influence on the device operation due to the SFs can be restricted.

In a case where an IGBT is formed as a semiconductor element in a SiC semiconductor device, a lifetime is lengthened so as to obtain a conductivity modulation effect for reducing an on-resistance, and a lifetime of minority carriers is not shortened as in the present embodiment. In a case where a vertical MOSFET is formed as a semiconductor element in a SiC semiconductor device as in the present embodiment, even if a lifetime of minority carriers is shortened, influences on a device operation and a breakdown voltage can be restricted.

In the comparative example, the carrier lifetime is shortened by providing the recombination enhancing layer having the n-type impurity concentration higher than the n-type impurity concentration of the n−-type drift layer between the n+-type substrate and the n−-type drift layer. However, according to the structure of the present embodiment, it is not necessary to provide the recombination enhancing layer. Therefore, since a manufacturing process of the recombination enhancing layer in which a transition element such as vanadium is used can be omitted, the manufacturing process can be simplified. Furthermore, since evaluations of a concentration and a film thickness of the recombination enhancing layer can be omitted, the manufacturing process is stabilized. As a result, a manufacturing cost of the SiC semiconductor device can be reduced. Further, since the recombination enhancing layer can be omitted, an on-resistance can be reduced.

Furthermore, since the carrier lifetime can be shortened, a surge at turning off can be restricted, and a recovery loss can be reduced.

Next, a manufacturing method of the SiC semiconductor device according to the present embodiment will be described with reference to FIG. 3A to FIG. 3E.

Figure 3A:
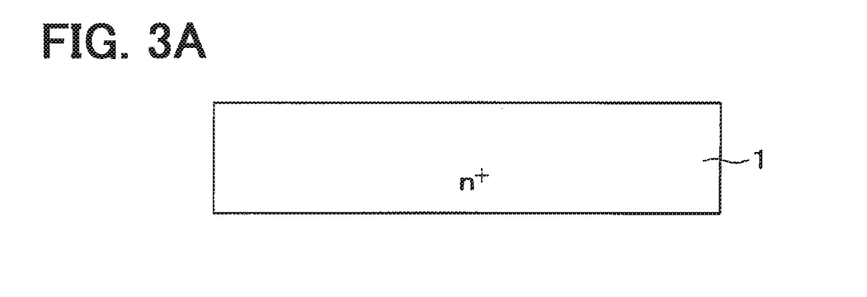
FIG. 3A is a cross-sectional view showing a manufacturing process of the SiC semiconductor device shown in FIG. 1.

[Process Shown in FIG. 3A]

First, a seed crystal made of a SiC single crystal is prepared, a SiC single crystal is grown on the seed crystal, for example, by a sublimation recrystallization method or a gas growth method to form a SiC single crystal ingot, and the SiC single crystal ingot is sliced into the n+-type substrate 1 having a wafer shape. At the time, a dopant gas of an n-type impurity such as nitrogen is introduced into a growth space of the SiC single crystal so that the n-type impurity concentration of the SiC single crystal becomes equal to the n-type impurity concentration of the n+-type substrate 1. Then, the temperature of the growth surface of the SiC single crystal is set to 2300'C to 2700° C.

When SiC single crystal is grown under such growth conditions that the growth surface temperature is 2300° C. or higher, when the n+-type substrate 1 is formed from the SiC single crystal ingot, the lifetime of minority carriers in the n+-type substrate 1 is reduced. Accordingly, the n+-type substrate 1 in which the lifetime of the minority carriers is 100 nsec or less can be prepared. In a case where the lifetime of the minority carriers in the n+-type substrate 1 does not become 100 nsec or less only by the growth conditions of the SiC single crystal, or in a case where the lifetime of the minority carriers is desired to be more shortened, a substance to be contamination is introduced. As the substance to be contamination, impurity ions which form a deep level with respect to SiC, such as iron, niobium, titanium, tantalum, or vanadium can be used.

In the SiC semiconductor substrate including the n+-type substrate 1 formed as described above, the lifetime of the minority carriers in the n+-type substrate 1 is 100 nsec or less. Further, an introduction amount of the dopant gas to be the n-type impurity is controlled, or introduction amounts of silane and propane used as raw material gases are controlled when the gas growth method is applied. As a result, the n+-type substrate 1 has the n-type impurity concentration of, for example, $5.0 \times 10^{18}/cm^3$ to $1.0 \times 10^{20}/cm^3$, and the specific resistance of 30 mΩcm or less.

Therefore, when the vertical MOSFET is formed in the following process, the SiC semiconductor substrate can have a low on-resistance and can shorten the lifetime of minority carriers so as to reduce the influence on device operation.

Further, the lifetime of the minority carriers in the n+-type substrate 1 can be controlled in accordance with the growth conditions of the n+-type substrate 1 and the introduction amount of the substance to be contamination. For example, the introduction amount of the substance to be contamination varies depending on the substance to be introduced. However, the lifetime is shortened by increasing the introduction amount. Therefore, the lifetime can be controlled by controlling the introduction amount of the substance to be contamination according to the conditions to which the SiC semiconductor device is applied.

Specifically, when the SiC semiconductor device is applied to a low current with a current density of several to several tens of $A/cm^2$, the lifetime is controlled to 100 nsec or less. When the SiC semiconductor device is applied to a large current with a current density of about 350 to several hundreds of $A/cm^2$, the lifetime is controlled to 60 nsec or less. Furthermore, when the SiC semiconductor device is applied to a larger current with a current density of 500 $A/cm^2$ or more, the lifetime is controlled to 30 nsec or less. In this manner, the lifetime can be controlled according to the current range to which the SiC semiconductor device is applied, so that the n+-type substrate 1 can be formed into a SiC semiconductor substrate capable of forming a vertical MOSFET corresponding to each current range.

Figure 3B:
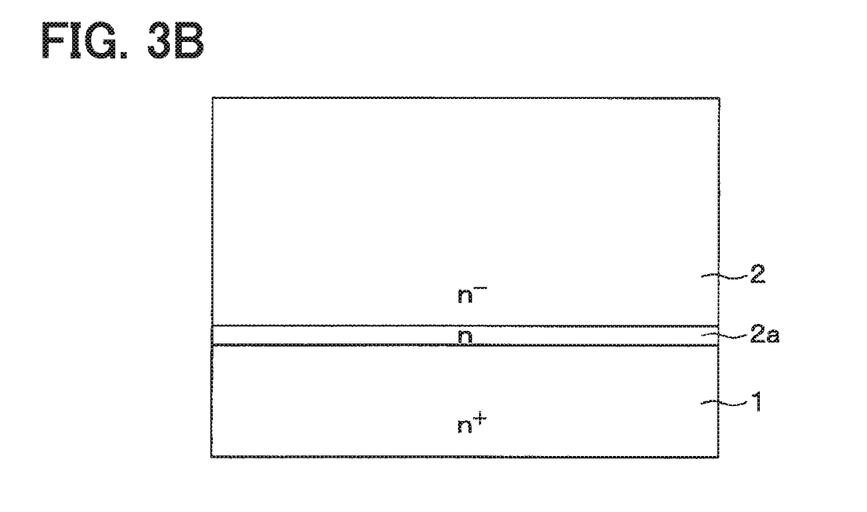
FIG. 3B is a cross-sectional view showing a manufacturing process of the SiC semiconductor device continued from FIG. 3A.

[Process Shown in FIG. 3B]

Subsequently, the n−-type drift layer 2 made of SiC is formed on the main surface of the n+-type substrate 1, for example, by using a chemical vapor deposition (CVD) apparatus. For example, in a case of the CVD method, a carrier gas of hydrogen and a dopant gas of an n-type impurity such as nitrogen is introduced in addition to silane and propane serving as source gases at a temperature of 1550° C. to 1650° C. to form the n−-type drift layer 2. At the time, for example, a flow rate of silane is set to 210 sccm, a flow rate of propane is set to 70 sccm, a flow rate of hydrogen is set to 98 slm, a flow rate of nitrogen is set to 15 sccm, and an atmospheric pressure is set to $1.33 \times 10^2$ Pa to $6.67 \times 10^4$ Pa (=1 Torr to 500 Torr). With such growth conditions, the surface of the n−-type drift layer 2 can be made as flat as possible. Therefore, even after performing an ion implantation or a process for shortening the lifetime of the minority carriers in a subsequent process, a surface roughness Ra can be brought closer to a flat surface. According to experiments by the inventor, the surface roughness Ra of the n−-type drift layer 2 can be kept within the range of 0.1 nm to 1 nm.

At this time, in order to restrict a lattice mismatch due to a concentration difference, if necessary, a buffer layer 2a having a higher impurity concentration than the n−-type drift layer 2 may be formed on the main surface of the n+-type substrate 1 before forming the n−-type drift layer 2. In this way, a so-called epitaxial substrate in which the n−-type drift layer 2 is formed on the n+-type substrate 1 is formed. The epitaxial substrate can also be handled as a SiC semiconductor substrate.

Thereafter, although not shown, after disposing a mask having openings at portions where the p-type deep layers 5 are to be formed, the p-type deep layers 5 are formed by an ion implantation of the p-type impurity. Then, after removing the mask, the p-type base region 3 and the n+-type source region 4 are formed above the n−-type drift layer 2 on which the p-type deep layer 5 is formed. For example, after the p-type base region 3 is epitaxially grown, the n+-type source region 4 is formed by an ion implantation of the n-type impurity. Alternatively, after the p-type base region 3 and the n+-type source region 4 are epitaxially grown, a p-type impurity is ion-implanted to form the contact region of the p-type base region 3. By performing the above-described processes, the p-type base region 3 and the n+-type source region 4 can be formed.

Figure 3C:
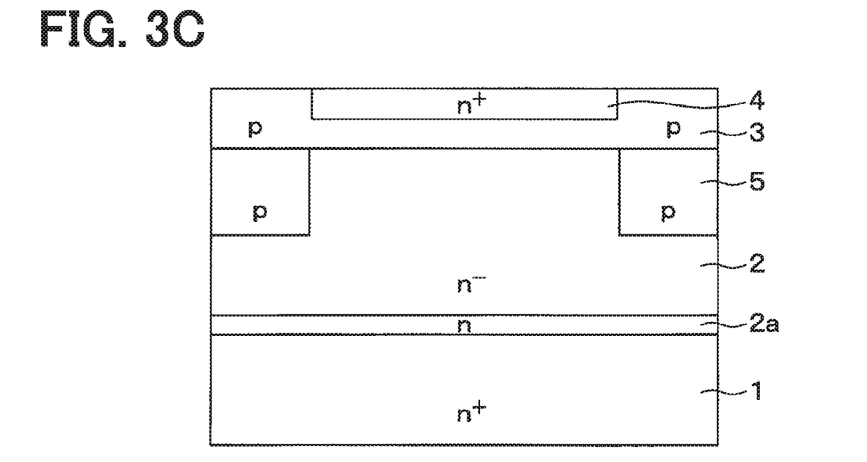
FIG. 3C is a cross-sectional view showing a manufacturing process of the SiC semiconductor device continued from FIG. 3B.

[Process Shown in FIG. 3C]

Next, an annealing process is performed at a temperature of 1700° C. or higher. The CVD or the like for forming the n−-type drift layer 2 is generally performed at a temperature of 1550° C. to 1650° C. The annealing process here is performed at a higher temperature. By performing the annealing process at such high temperature, the lifetime of the minority carriers in the n−-type drift layer 2 can be shortened.

The lifetime of the minority carriers in the n−-type drift layer 2 can also be shortened by performing an irradiation process with an electron beam or a positron beam in addition to the annealing process or in place of the annealing process. By the irradiation process with the electron beam or the positron beam, for example, $Z_{1/2}$ centers originating from C vacancies can be introduced and can function as lifetime killers. Although only the irradiation process of the electron beam or the positron beam may be performed, when the irradiation process is performed in addition to annealing process, the lifetime of minority carriers in the n−-type drift layer 2 can be further shortened. In a case of irradiating the electron beam, for example, irradiation energy is set to 200 keV and a dose amount is set to $2 \times 10^{16}/cm^2$. In a case of irradiating the positron beam, for example, irradiation energy is set to 100 eV and a dose amount is set to $1 \times 10^{16}/cm^2$.

Thus, by performing at least one of the annealing process or the irradiation process with the electron beam or the positron beam, the lifetime of minority carriers in the n−-type drift layer 2 can be shortened. In a case where neither of the above-described processes is carried out, the lifetime of the minority carriers in the n−-type drift layer 2 is larger than 1 μsec. However, by performing at least one of above-described processes, the lifetime of the minority carriers in the n−-type drift layer 2 can be 1 μsec or less.

Although the lifetime of the minority carriers in the n−-type drift layer 2 is shortened by the annealing process or the irradiation process in the above description, the lifetime of the minority carriers in the n+-type substrate 1 can also be further shortened by the annealing process or the irradiation process.

Figure 3D:
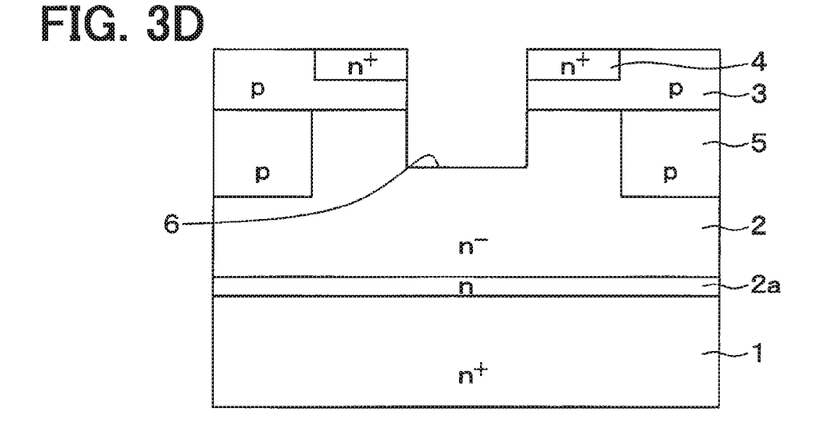
FIG. 3D is a cross-sectional view showing a manufacturing process of the SiC semiconductor device continued from FIG. 3C.

[Process Shown in FIG. 3D]

Next, a mask (not shown) is disposed on the surfaces of the p-type base region 3 and the n+-type source region 4, and a portion of the mask where the trench gate structure is to be formed is opened. Then, anisotropic etching such as reactive ion etching (RIE) is performed using the mask to form the gate trench 6. For example, etching is performed so that the depth of the gate trench 6 is set to be 0.2 μm to 0.4 μm deeper than the total film thickness of the p-type base region 3 and the n+-type source region 4. Accordingly, the protrusion amount of the gate trench 6 from the bottom of the p-type base region 3 is set to 0.2 μm to 0.4 μm.

Figure 3E:
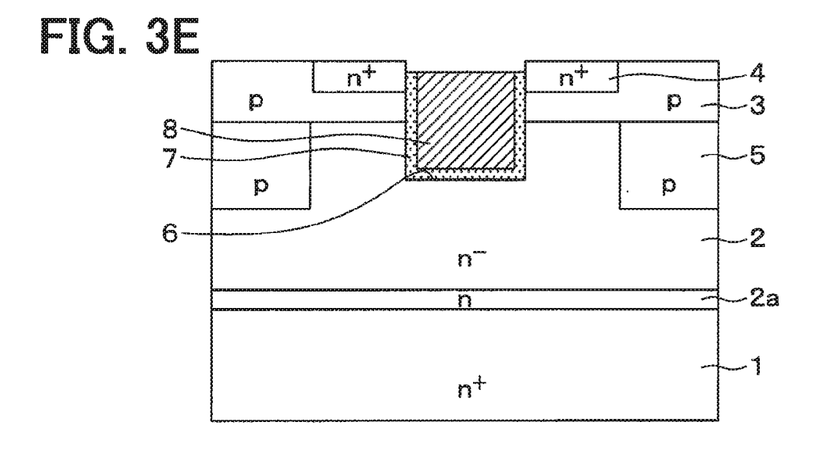
FIG. 3E is a cross-sectional view showing a manufacturing process of the SiC semiconductor device continued from FIG. 3D.

[Process Shown in FIG. 3E]

After removing the mask, for example, thermal oxidation is performed to form the gate insulation film 7, and the gate insulation film 7 covers the inner wall surface of the gate trench 6 and the surface of the n+-type source region 4. Then, after depositing polysilicon doped with, for example, an n-type impurity, polysilicon is etched back to leave polysilicon in at least in the gate trench 6, thereby forming the gate electrode 8.

Figure 3F:
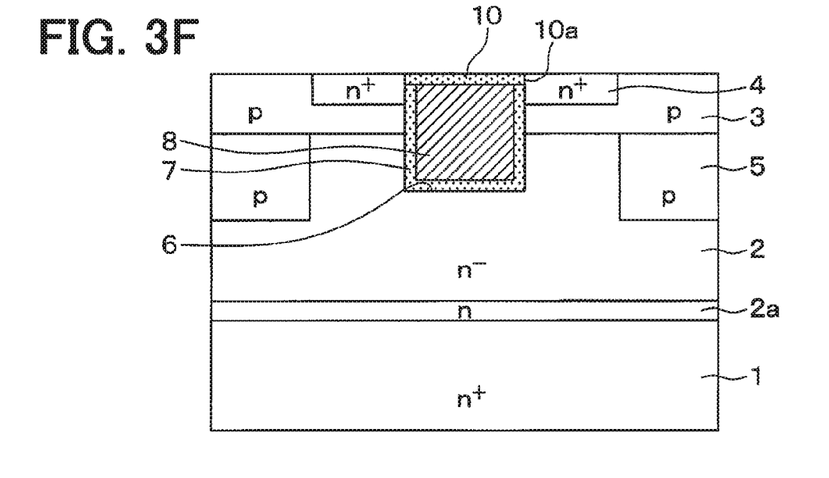
FIG. 3F is a cross-sectional view showing a manufacturing process of the SiC semiconductor device continued from FIG. 3E.

[Process Shown in FIG. 3F]

The interlayer insulating film 10 is formed on the surfaces of the gate insulating film 7 and the gate electrode 8 by using, for example, a CVD apparatus. Then, the gate insulating film 7 is pattered together with the interlayer insulating film 10 to remove unnecessary portions, thereby forming contact holes 10a. Accordingly, the surfaces of the p-type base region 3 and the n+-type source region 4 can be exposed through the contact holes 10a.

Although subsequent processes are not shown, an electrode material having, for example, a multilayer structure of a plurality of metals is formed on the surface of the interlayer insulating film 10. Then, the source electrode 11 is formed by patterning the electrode material. The SiC semiconductor device according to the present embodiment is completed by performing a process of forming the drain electrodes 12 on the rear surface of the n+-type substrate 1.

As described above, in the SiC semiconductor device according to the present embodiment, the lifetime of minority carriers in the n+-type substrate 1 is set to 100 nsec or less. Therefore, when a large current flows through the parasitic FWD of the vertical MOSFET, even if the minority carriers reach the n+-type substrate 1, the minority carriers disappear in a short period, and the BPDs present near the interface between the n+-type substrate 1 and the n−-type drift layer 2 can be restricted from becoming the SFs. Accordingly, an influence on the device operation due to the SFs can be restricted.

Other Embodiments

The present disclosure is not limited to the above-described embodiment and may be suitably modified.

For example, in the above-described embodiment, the annealing process is performed after forming the n+-type source region 4 and before forming the trench gate structure. However, a timing of the annealing process is not limited, and the annealing process may be performed at any stage in the manufacturing process. However, when the gate insulating film 7 is formed of a silicon oxide film, there is a possibility that the gate insulating film 7 is melted or evaporated by performing a high-temperature annealing process. Therefore, it is preferable to perform the annealing process before forming the gate insulating film 7.

Similarly, in the above-described embodiment, the irradiation process with the electron beam or the positron beam is performed after forming the n+-type source region 4 and before forming the trench gate structure. However, a timing of the irradiation process is not limited, and may be performed at any stage in the manufacturing process. In addition, the electron beam or the positron beam is irradiated from a side close to the p-type base region 3 or n+-type source region 4 in the above-described embodiment, but the electron beam or the positron beam may also be irradiated from a side close to the n+-type substrate 1.

As described above, the epitaxial substrate can also be handled as the SiC semiconductor substrate. In the present case, since the SiC semiconductor device in which the lifetime of minority carriers not only in the n+-type substrate 1 but also in the n−-type drift layer 2 is shortened is used, the influence on the device operation can be further reduced. The timing for shortening the lifetime of the minority carriers in the n−-type drift layer 2 is not limited. Therefore, if the process for shortening the lifetime of the minority carriers in the n−-type drift layer 2 is performed at a time when the n−-type drift layer 2 is formed on the n+-type substrate 1, an epitaxial substrate in which the lifetime of the minority carriers is shortened can be obtained.

In the above embodiment, the vertical MOSFET has been described as an example of a vertical semiconductor element. However, the present disclosure may also be applied to a unipolar device in which a device operation and a breakdown voltage are not affected even if a lifetime of minority carriers is shortened.

In the above-described embodiment, an n channel-type vertical MOSFET in which the first conductivity type is n-type and the second conductivity type is p-type has been described as an example. Alternatively, the conductivity type of each element may be reversed so as to form a p channel-type vertical MOSFET. Furthermore, not limited to a trench gate-type MOS structure, the vertical MOSFET may have a planar-type MOS structure. That is, as long as a the vertical MOSFET has a structure in which the gate insulating film 7 is formed on the surface of the p-type base region 3 between the n−-type drift layer 2 and the n+-type source region 4 and the gate electrode 8 is disposed on the gate insulating film 7, the vertical MOSFET may be either the trench gate-type or the planar-type.

In the case of indicating the crystal orientation, a bar (-) should be added over a desired number properly. Since there is restriction on expression based on electronic filing, in the present specification, a bar is attached before a desired number.

What is claimed is:

1. A silicon carbide semiconductor substrate comprising
a first conductivity type substrate doped with a first conductivity type impurity to have a first conductivity type and having a specific resistance of 30 mΩ cm or less, wherein a lifetime of minority carriers in the first conductivity type substrate is set to 100 nsec or less, and
a drift layer is disposed above the first conductivity type substrate, made of an epitaxial film, and having a first conductivity type impurity concentration that is lower than a first conductivity type impurity concentration of the first conductivity type substrate.

2. The silicon carbide semiconductor substrate according to claim 1, wherein
the first conductivity type substrate has a first conductivity type impurity concentration of $5.0 \times 10^{18}/cm^3$ to $1.0 \times 10^{20}/cm^3$.

3. The silicon carbide semiconductor substrate according to claim 1, wherein
the first conductivity type substrate is introduced with at least one impurity substance selected from the group consisting of iron, niobium, titanium, tantalum, and vanadium.

4. The silicon carbide semiconductor substrate according to claim 1, wherein the drift layer is disposed on the first conductivity type substrate.

5. The silicon carbide semiconductor substrate according to claim 4, wherein
the drift layer has the first conductivity type impurity concentration of $1.0 \times 10^{15}/cm^3$ to $5.0 \times 10^{16}/cm^3$.

6. The silicon carbide semiconductor substrate according to claim 4, wherein
a lifetime of minority carriers in the drift layer is set to 1 μec or less.

7. The silicon carbide semiconductor substrate according to claim 4, wherein
the drift layer is introduced with a $Z_{1/2}$ center, and a density of the $Z_{1/2}$ center is $2.0 \times 10^{13}/cm^3$ or higher.

8. A silicon carbide semiconductor device having a vertical MOSFET comprising:
a first conductivity type substrate doped with a first conductivity type impurity to have a first conductivity type and having a specific resistance of 30 mΩ cm or less, a lifetime of minority carriers in the first conductivity type substrate being set to 100 nsec or less;
a drift layer disposed on, or above, the first conductivity type substrate, made of an epitaxial film, and having a first conductivity type impurity concentration that is lower than a first conductivity type impurity concentration of the first conductivity type substrate;
a base region disposed on the drift layer and having a second conductivity type;
a source region disposed on the base region, made of a first conductivity type silicon carbide, and having a first conductivity type impurity concentration that is higher than the first conductivity type impurity concentration of the drift layer;
a gate insulating film disposed on a surface of the base region between the drift layer and the source region;
a gate electrode disposed on the gate insulating film;
an interlayer insulating film covering the gate electrode and the gate insulating film and having a contact hole;
a source electrode electrically connected with the source region through the contact hole; and
a drain electrode disposed on a rear surface side of the first conductivity type substrate.

9. A method of manufacturing a silicon carbide semiconductor, comprising:
growing a silicon carbide (SiC) single crystal ingot on a SiC seed crystal;
dicing the SiC single crystal ingot into a SiC single crystal substrate having a wafer shape;
introducing a first conductivity type impurity to the SiC single crystal substrate such that a specific resistance of the SiC single crystal substrate is 30 mΩ cm or less; and
heating a growth surface of the SiC single crystal substrate to a temperature of 2300° C. or higher such that a lifetime of minority carriers in the first conductivity type substrate is 100 nsec or less.

10. The method of manufacturing a silicon carbide semiconductor according to claim 9, wherein
the growth surface of the SiC crystal is heated to a temperature of 2300° C. to 2700° C.

11. The method of manufacturing a silicon carbide semiconductor according to claim 9, further comprising
forming a drift layer on, or above, an upper surface of the SiC single crystal substrate, wherein the drift layer has a first conductivity type impurity concentration that is lower than a first conductivity type impurity concentration of the SiC single crystal substrate.

12. The method of manufacturing a silicon carbide semiconductor according to claim 11, further comprising
forming a $Z_{1/2}$ center in the drift layer having a density of the $Z_{1/2}$ center is $2.0\times10^{13}/cm^3$ or higher to reduce the lifetime of the minority carriers in the drift layer.

13. The method of manufacturing a silicon carbide semiconductor according to claim 12, further comprising
forming a base region on the drift layer and having a second conductivity type;
forming a source region on the base region, wherein the source region is made of a first conductivity type silicon carbide and has a first conductivity type impurity concentration that is higher than the first conductivity type impurity concentration of the drift layer;
forming a gate insulating film on a surface of the base region between the drift layer and the source region;
forming a gate electrode on the gate insulating film;
forming an interlayer insulating film covering the gate electrode and the gate insulating film and having a contact hole;
forming a source electrode electrically connected with the source region through the contact hole; and
forming a drain electrode disposed on a rear surface side of the first conductivity type substrate.

* * * * *